(12) United States Patent
Seo et al.

(10) Patent No.: US 9,535,333 B2
(45) Date of Patent: Jan. 3, 2017

(54) MASKLESS EXPOSURE DEVICE AND MASKLESS EXPOSURE METHOD USING THE SAME

(71) Applicant: SAMSUNG DISPLAY CO., LTD., Yongin-si, Gyeonggi-do (KR)

(72) Inventors: Kab-Jong Seo, Seoul (KR); Hi-Kuk Lee, Yongin-si (KR); Jae-Hyuk Chang, Seongnam-si (KR); Ki-Beom Lee, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/836,422

(22) Filed: Aug. 26, 2015

(65) Prior Publication Data

US 2016/0202615 A1 Jul. 14, 2016

(30) Foreign Application Priority Data

Jan. 13, 2015 (KR) ........................ 10-2015-0005915

(51) Int. Cl.
*G03B 27/44* (2006.01)
*G03B 27/54* (2006.01)
*G03F 7/20* (2006.01)

(52) U.S. Cl.
CPC ................................ *G03F 7/70141* (2013.01)

(58) Field of Classification Search
CPC .. G03F 7/70141; G03F 7/702; G03F 7/70208; G03F 7/70383; G03F 7/70391; G03F 7/70425; G03F 7/70475; G03F 7/7085

USPC ............... 355/46, 52, 53, 54, 55, 66–71, 77; 250/492.1, 492.2, 492.22, 492.23, 493.1, 250/548; 356/153, 399–401
See application file for complete search history.

(56) References Cited

U.S. PATENT DOCUMENTS

| | | | | |
|---|---|---|---|---|
| 6,051,842 A * | 4/2000 | Yamamoto | ............ | G03F 7/7005 250/214 PR |
| 2003/0214571 A1* | 11/2003 | Ishikawa | ............ | B23K 26/0604 347/255 |
| 2005/0002005 A1* | 1/2005 | Terada | ................ | G03F 7/70733 355/53 |
| 2006/0092419 A1* | 5/2006 | Gui | ...................... | G03F 7/70216 356/401 |
| 2009/0097002 A1* | 4/2009 | Fukuda | ............... | G03F 7/70791 355/53 |

FOREIGN PATENT DOCUMENTS

| | | |
|---|---|---|
| KR | 1020070101811 | 10/2007 |
| KR | 1020110072440 | 6/2011 |
| KR | 1020120010424 | 2/2012 |
| KR | 1020120100209 | 9/2012 |

* cited by examiner

*Primary Examiner* — Christina Riddle
(74) *Attorney, Agent, or Firm* — F. Chau & Associates, LLC (57) ABSTRACT

A maskless exposure device includes a plurality of exposure heads, each exposure head including a digital micro-mirror device configured to scan an exposure beam to a substrate, the exposure heads being disposed in staggered first and second rows, a plurality of reflecting members disposed on side surfaces of the exposure heads and having reflecting surfaces parallel with each other, a light emitting part configured to light to the reflecting members, and a light receiving part configured to receive light via the reflecting members.

20 Claims, 10 Drawing Sheets

MASKLESS EXPOSURE DEVICE AND MASKLESS EXPOSURE METHOD USING THE SAME

CROSS-REFERENCE TO RELATED APPLICATIONS

This application claims priority under 35 U.S.C. §119 from Korean Patent Application No. 10-2015-0005915, filed on Jan. 13, 2015 in the Korean Intellectual Property Office, and all the benefits accruing therefrom, the contents of which are herein incorporated by reference in their entirety.

BACKGROUND

1. Technical Field

Exemplary embodiments of the present inventive concept are directed to a maskless exposure device and a maskless exposure using the maskless exposure device.

2. Discussion of the Related Art

In general, to form a metal pattern that includes a thin film transistor ("TFT"), which is a switching element of a display substrate, and signal lines, a metal layer and a photoresist layer are sequentially formed, and a mask corresponding to the metal pattern is disposed on the photoresist layer.

Then, light is irradiated to an upper surface of the mask so that the photoresist layer is exposed and developed. Thus, a photoresist pattern corresponding to the mask is formed. The metal layer is etched to form the metal pattern. When the metal layer is etched, the photoresist pattern functions as an etch stop layer.

A display substrate that includes a plurality of metal patterns having different shapes may require a plurality of masks corresponding to the number of the metal patterns. In addition, when the shape of the metal pattern needs to be changed, the shape of the mask should be correspondingly changed so that a new mask should be fabricated. Since the fabricating cost of the mask is relatively high, a manufacturing cost of the display substrate may increase.

To address the above situation, a maskless exposure device that can provide a plurality of beams to a substrate without a mask can be used. In a maskless exposure device, beams are independently turned on or off so that the beams are selectively irradiated to a substrate. Thus, a desired photoresist pattern may be formed on the substrate.

However, when an exposure head of the maskless exposure device moves, exposure defects may occur. Accordingly, defects, such as display panel stains, may occur.

SUMMARY

Exemplary embodiments of the present inventive concept can provide a maskless exposure device capable of decreasing defects on display panel.

Exemplary embodiments of the present inventive concept can further provide a maskless exposure method capable of decreasing defects on display panel.

In an exemplary embodiment of a maskless exposure device according to the present inventive concept, the maskless exposure device includes a plurality of exposure heads, each exposure head including a digital micro-mirror device configured to scan an exposure beam to a substrate, wherein the exposure heads are disposed in staggered first and second rows, a plurality of reflecting members disposed on side surfaces of the exposure heads and having reflecting surfaces parallel with each other, a light emitting part configured to emit light to the reflecting members and a light receiving part configured to receive light via the reflecting members.

In an exemplary embodiment, light emitted from the light emitting part may be received by the light receiving part via all reflecting members.

In an exemplary embodiment, the maskless exposure device may further include a control part configured to control an alignment of the exposure heads.

In an exemplary embodiment, the maskless exposure device may further include a system control part configured to control the digital micro-mirror device using a graphic data system file.

In an exemplary embodiment, the system control part may include a file producing part configured to produce graphic data system file respectively corresponding to each of a plurality of patterns to be formed on the substrate, a data outputting part configured to generate digital micro-mirror device on/off data from the graphic data system files to control on/off timing of the digital micro-mirror device and a transfer control part configured to output a transfer signal which transfers a stage configured to fix the substrate.

In an exemplary embodiment, the transfer control part may control on/off timing of the exposure beam in response to the digital micro-mirror device on/off data received from the data outputting part, and transfers the stage.

In an exemplary embodiment of a maskless exposure device according to the present inventive concept, the maskless exposure device includes a plurality of exposure heads configured to scan exposure beams to a substrate and disposed in staggered first and second rows, a plurality of reflecting members disposed on side surfaces of the exposure heads and having reflecting surfaces parallel with each other, one or more light emitting parts configured to emit light to the reflecting members, and one or more light receiving parts configured to receive the light emitted from the one or more light emitting parts via the reflecting members, where light emitted from each of the one or more light emitting parts is received by a respective light receiving part of the one or more light receiving parts via the reflecting members.

In an exemplary embodiment, one or more light receiving parts may include one light receiving part, and the one or more light receiving parts may include one light receiving part, and the light emitted from the one light emitting part may be received by the one light receiving part via all reflecting members.

In an exemplary embodiment, a condition of no light being received by the one light receiving part may indicate that at least one of the plurality of reflecting members having been moved.

In an exemplary embodiment, the one or more light receiving parts may include a first light emitting part configured to emit light to the reflecting members; a second light emitting part configured to emit light to the reflecting members and disposed adjacent to the first light emitting part; and a third light emitting part configured to emit light to the reflecting members and disposed adjacent to the first light emitting part, and the one or more light receiving parts may include a first light receiving part configured to receive light from the first light emitting part via the reflecting members; a second light receiving part configured to receive light from the second light emitting part via the reflecting members and disposed adjacent to the first light receiving part; and a third light receiving part configured to receive light from the third light emitting part via the reflecting members and disposed adjacent to the first light receiving part.

In an exemplary embodiment, light emitted from the second light emitting part may be received by the second light receiving part via a (3n−1)-th reflecting member of the first row, where 'n' is a natural number, and a 3n-th reflecting member of the second row.

In an exemplary embodiment, light emitted from the third light emitting part may be received by the third light receiving part via a 3n-th reflecting member of the first row ('n' is a natural number) and a (3n−2)-th reflecting member of the second row.

In an exemplary embodiment, a condition of no light being received by at least one of the first, second, or third light receiving parts may indicate that at least one of the plurality of reflecting members having been moved.

In an exemplary embodiment, the maskless exposure device may further include a control part configured to control an alignment of the exposure heads.

In an exemplary embodiment of a method of maskless exposure according to the present inventive concept, the method includes starting an exposure using a maskless exposure device, where the maskless exposure device includes a plurality of exposure heads configured to scan exposure beams to a substrate and disposed in staggered first and second rows, a plurality of reflecting members disposed on side surfaces of the exposure heads and having reflecting surfaces parallel with each other, a light emitting part configured to emit light to the reflecting members and a light receiving part configured to receive light via the reflecting members, sensing movement of the exposure heads, realigning the exposure heads when the movement of the exposure heads is detected, and re-starting the exposure.

In an exemplary embodiment, light emitted from the light emitting part may be received by the light receiving part via the reflecting members.

In an exemplary embodiment, sensing movement of the exposure heads may include stopping the exposure when no light is received by the light receiving part.

In an exemplary embodiment, the light emitting part may include a first light emitting part configured to emit light to the reflecting members, a second light emitting part configured to emit light to the reflecting members and disposed adjacent to the first light emitting part and a third light emitting part configured to emit light to the reflecting members and disposed adjacent to the first light emitting part. The light receiving part may include a first light receiving part configured to receive light from the first light emitting part via the reflecting members, a second light receiving part configured to receive light from the second light emitting part via the reflecting members and disposed adjacent to the first light receiving part and a third light receiving part configured to receive light from the third light emitting part via the reflecting members and disposed adjacent to the first light receiving part.

In an exemplary embodiment, light emitted from the first light emitting part may be received by the first light receiving part via all reflecting members. Light emitted from the second light emitting part may be received by the second light receiving part via a (3n−1)-th reflecting member of the first row, where 'n' is a natural number, and a 3n-th reflecting member of the second row. Light emitted from the third light emitting part may be received by the third light receiving part via a 3n-th reflecting member of the first row and a (3n−2)-th reflecting member of the second row.

In an exemplary embodiment, sensing movement of the exposure heads may include stopping the exposure when no light is received by at least one of the first to third light receiving parts.

According to a present exemplary embodiment, the exposure part includes a light emitting part and a light receiving part mounted on a gantry and a reflecting member disposed on a side surface of each exposure head. Light from the light emitting part is received by the light receiving part via the reflecting members. Thus, when no light is received by the light receiving part, it may be determined that at least one of the exposure heads has moved. That is, movement of the exposure heads during the exposure process may be detected in real time. Therefore, a more precise exposure may be performed.

DETAILED DESCRIPTION OF EXEMPLARY EMBODIMENTS

Hereinafter, exemplary embodiments of the present disclosure will be explained in detail with reference to the accompanying drawings.

Figure 1:
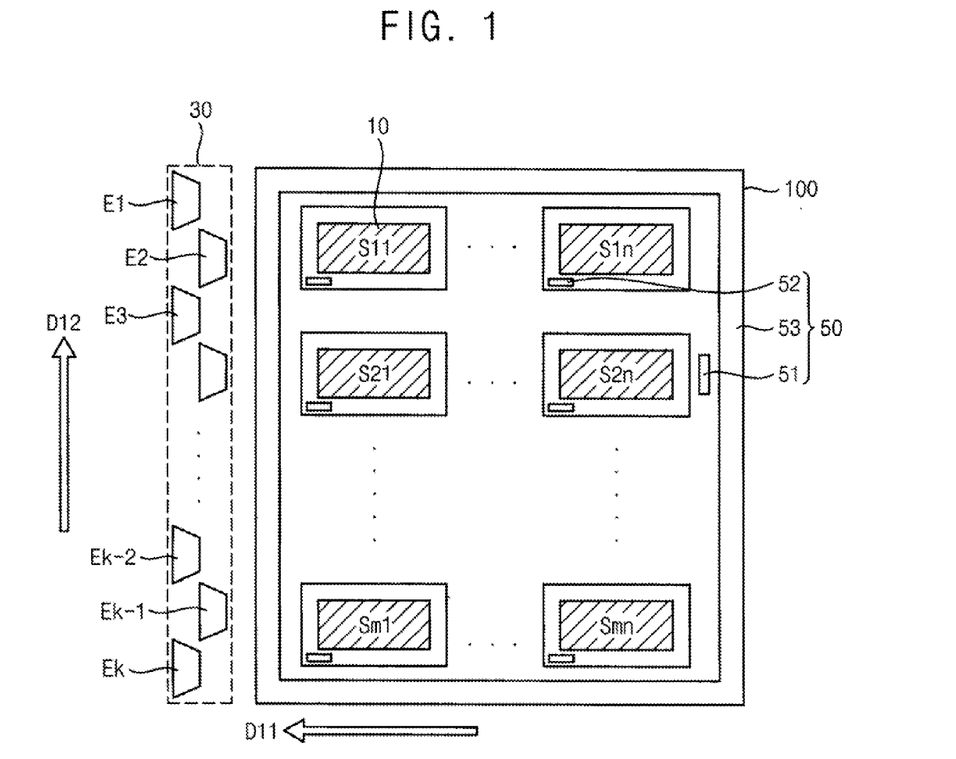
FIG. 1 is a plan view of a maskless exposure device according to an exemplary embodiment of the present inventive concept.

FIG. 1 is a plan view of a maskless exposure device according to an exemplary embodiment of the present inventive concept.

Referring to FIG. 1, a substrate 100 is a main substrate for forming a display panel. The substrate 100 includes a plurality of first areas 10 and a plurality of second areas 50 exclusive of the first areas 10. A plurality of display panels S11, ... , Smn are disposed in a matrix pattern with one display panel formed in each first area 10. In this case, 'm' and 'n' are natural numbers. The second areas 50 includes glass ID areas 51 where an identification number of the substrate 100 is formed, and cell ID areas 52 where an identification number of the each display panel is formed. In addition, the second areas 50 include an edge exposure area 53 that is an edge portion of the substrate 100.

The substrate 100 is transferred below an exposure part 30 along a first direction D11 to be exposed. The substrate 100 is transferred to the exposure part 30 by a stage disposed below the substrate 100.

To expose the substrate 100, a step exposing method or a scan exposing method may be employed. In a step exposing method, a substrate is repeatedly transferred and stopped during exposure. In a scan exposing method, a substrate is continuously transferred during exposure. For example, an island pattern may be formed through a step exposing method, and a strip pattern may be formed through a scan exposing method.

The exposure part 30 includes a plurality of exposure heads E1, E2, E3, . . . , Ek−2, Ek−1 and Ek. The exposure heads E1, E2, E3, . . . , Ek−2, Ek−1 and Ek are arranged in a second direction D12 substantially perpendicular to the first direction D11. In this case, 'k' is a natural number.

For example, the exposure heads E1, E2, E3, . . . , Ek−2, Ek−1 and Ek may be disposed in two rows. The exposure heads of a first row and the exposure heads of a second row may be alternately disposed in the second direction D12. In addition, the exposure heads E1, E2, E3, . . . , Ek−2, Ek−1 and Ek may have various other arrangements in the second direction D12.

The exposure part 30 exposes the substrate 100 being transferred in the first direction D11, so that an exposure pattern is formed in a direction reverse to the first direction D11.

Each exposure head E1, E2, E3, . . . , Ek−2, Ek−1 and Ek includes a digital micro-mirror device ("DMD"). A DMD may irradiate an exposure beam in response to an on/off data signal. A source beam from a digital mirror of a cell of the DMD is reflected to generate the exposure beam, and an exposure beam may exit from each exposure head E1, E2, E3, . . . , Ek−2, Ek−1 and Ek.

Figure 2:
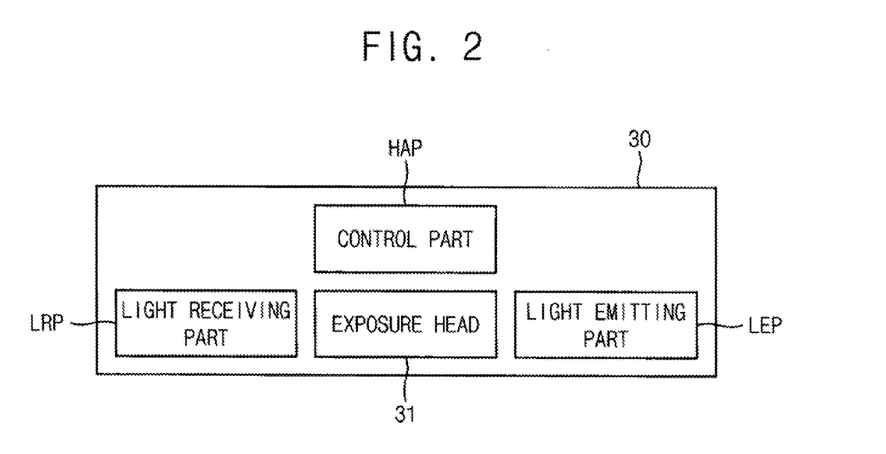
FIG. 2 is a block diagram of an exposure part according to an exemplary embodiment of the present inventive concept.

FIG. 2 is a block diagram of an exposure part according to an exemplary embodiment of the present inventive concept.

Referring to FIG. 2, an exposure part according to an exemplary embodiment of the present inventive concept includes an exposure head 31, a light emitting part LEP, a light receiving part LRP and control part HAP.

Each exposure head 31 includes a digital micro-mirror device ("DMD") configured to reflect a source beam received from an exposure source to a substrate to scan an exposure beam to the substrate. The exposure heads 31 may be disposed in staggered first and second rows.

A reflecting member may be disposed on a side surface of the exposure head 31. The light emitting part LEP may be disposed adjacent to the exposure head 31. The light emitting part LEP provides the reflecting member with light. For example, the light may be a laser beam.

The light receiving part LRP receives light from the light emitting part LEP via the reflecting member. When light is received by the light receiving part LRP, it is determined that the exposure heads have not moved. However, when no light is received by the light receiving part LRP, it is determined that at least one of the exposure heads has moved.

When the exposure heads have been determined to have moved, an exposure process is stopped. Thereafter, the control part HAP adjusts an alignment of the exposure heads. For example, data for aligning the exposure heads may be stored in the control part HAP. Thus, the control part HAP adjusts an alignment of the exposure heads based on the data stored in the control part HAP. After the exposure heads have been aligned, the exposure process may be restarted.

Figure 3:
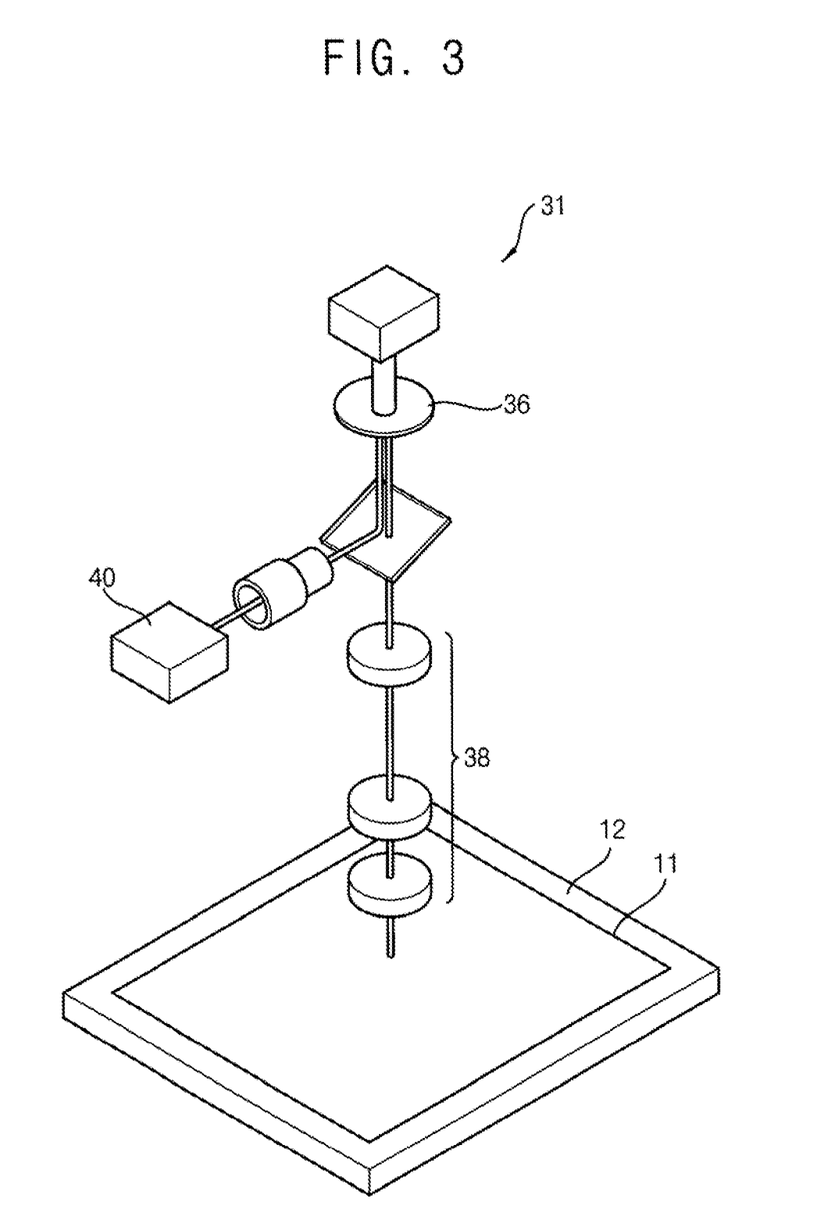
FIG. 3 is a perspective view of an exposure head according to an exemplary embodiment of the exposure device of FIG. 1.

FIG. 3 is a perspective view of an exposure head according to an exemplary embodiment of the exposure device of FIG. 1.

Referring to FIGS. 1 and 3, the exposure head 31 includes the DMD 36. The DMD 36 receives the source beam from an exposure source 40. The source beam may be an ultraviolet (UV) ray for exposing a photoresist film 11. The photoresist film 11 may be formed on a target substrate 12 corresponding to an object to be exposed. When a pattern needs to be formed on a substrate, the photoresist film 11 is used to form a mask of the pattern. The photoresist film 11 may be formed by coating a photosensitive resin such as an epoxy resin on a surface of a glass substrate. The DMD 36 selectively reflects the source beam for each pixel based on image data onto the target substrate 12.

The exposure head 31 includes a projection optical device 38. The projection optical device 38 includes a plurality of lenses, and converts light selectively reflected from the DMD 36 into the exposure beam.

Figure 4:
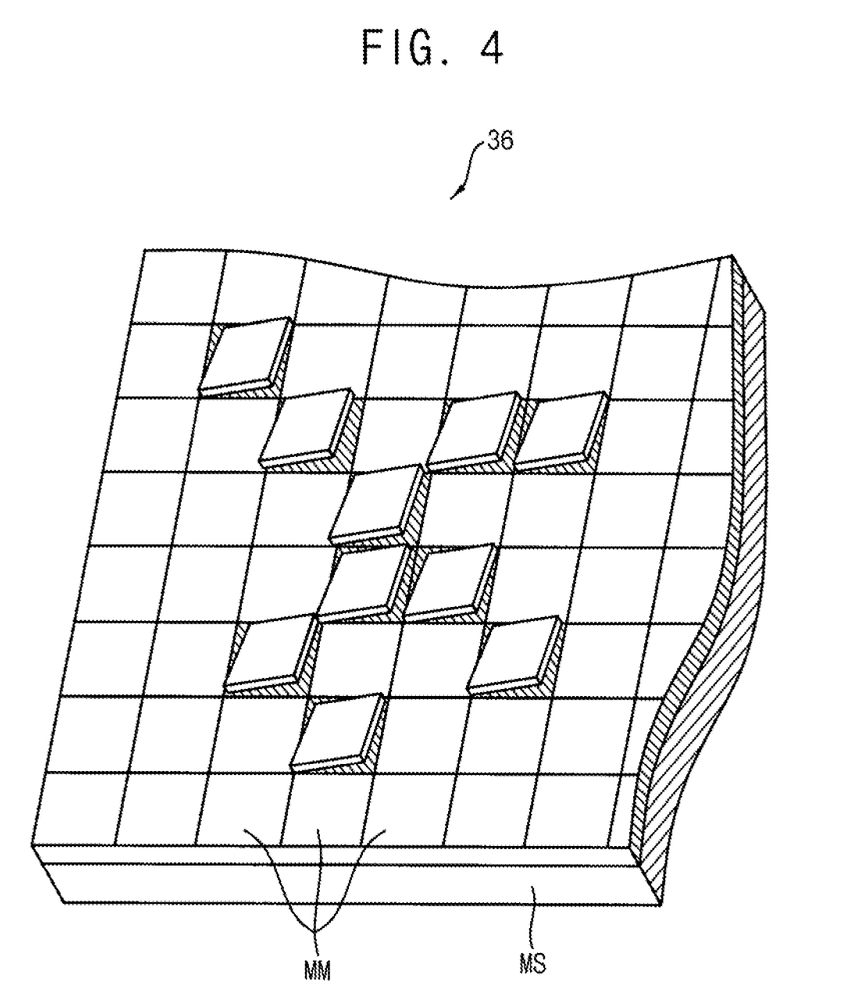
FIG. 4 is a perspective view of a digital micro-mirror device ("DMD") of a maskless exposure device according to an exemplary embodiment of the present inventive concept.

FIG. 4 is a perspective view illustrating a digital micromirror device ("DMD") of a maskless exposure device according to an exemplary embodiment of the present inventive concept.

Referring to FIG. 4, a DMD 36 of a maskless exposure device according to an exemplary embodiment of the present inventive concept includes a memory cell MS and a plurality of micro-mirrors MM arranged in a matrix form with L rows×M columns. An angle of a micro-mirror MM may be controlled according to a control signal generated based on image data. Accordingly, a desired light may be reflected to the projection optical device 38, and an undesired light may be reflected at a different angle to be blocked.

When a digital signal is inputted to the memory cell MS of the DMD 36, the micro-mirrors MM tilt at certain angles with respect to a diagonal, for example, ±12°. Light reflected by an "on" micro-mirror MM exposes a photoresist on a substrate, and a light reflected by an "off" micro-mirror MM of "off" does not expose a photoresist on a substrate.

Figure 5:
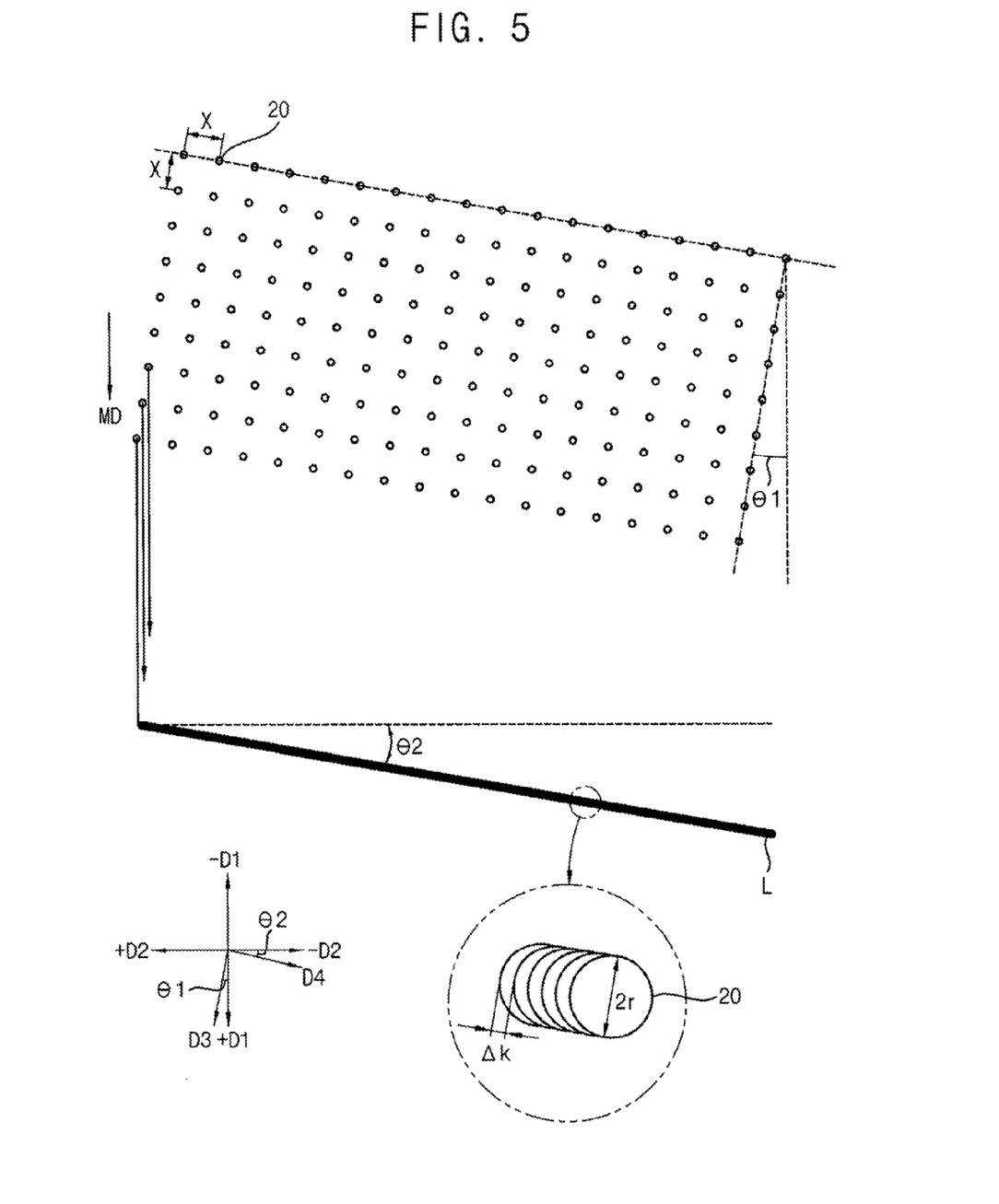
FIG. 5 is a plan view of an exposure step using an exposure head in FIG. 1.

FIG. 5 is a plan view of an exposure step using an exposure head in FIG. 1.

Referring to FIG. 5, a maskless exposure device according to an exemplary embodiment of the present inventive concept may be inclined by a first angle $\theta_1$ with respect to a side of a substrate SUB that extends in first directions +D1 and −D1. Let a second direction +D2 and −D2 define a direction substantially perpendicular to the first direction +D1 and −D1, then an inclined direction of the maskless exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the maskless exposure device may be a third direction D3 between the positive first direction +D1 and the positive second direction +D2. The first angle $\theta_1$ may be an acute angle rotated clockwise with respect to a reference line extending in the first direction +D1 and −D1. For example, the first angle $\theta_1$ may be between about 0.1° and about 0.5°.

The maskless exposure device inclined with respect to the third direction D3 provides spot beams 20 onto the substrate SUB along a scanning direction MD. The scanning direction MD is substantially the same as the first positive direction +D1. If the first angle $\theta_1$ of the maskless exposure device is about 0° and the maskless exposure device exposes the substrate SUB along the positive first direction +D1, a region on the substrate SUB between adjacent spot beams 20 is not exposed. Therefore, to expose an entire predetermined region, the maskless exposure device is inclined with respect to the substrate SUB by the first angle $\theta_1$ to provide light onto the substrate SUB.

When micro-mirrors receive data and the spot beams 20 are irradiated onto a stopped substrate SUB, the spot beams 20 are spaced apart from each other in the third direction D3 by a predetermined distance "x." In addition, the spot beams 20 are spaced apart from each other in a direction substantially perpendicular to the third direction D3 by the determined distance "x."

To selectively expose a predetermined region of the substrate SUB, for example, a pattern-forming region L, the spot beams 240 are selectively irradiated into the pattern-forming region L. In a present example embodiment, the pattern-forming region L is defined as a region extending along a fourth direction D4 inclined in a clockwise direction with respect to a side of the substrate SUB by a second angle $\theta_2$. The pattern-forming region L have a rectangular shape that extends in the fourth direction D4. When the maskless exposure device exposes the entire pattern-formed region L, circular-shaped spot beams 20 having a diameter "2r" overlap each other by a predetermined distance "Δk" in the pattern-formed region L so that the substrate SUB of the pattern-formed region L is entirely exposed.

Figure 6:
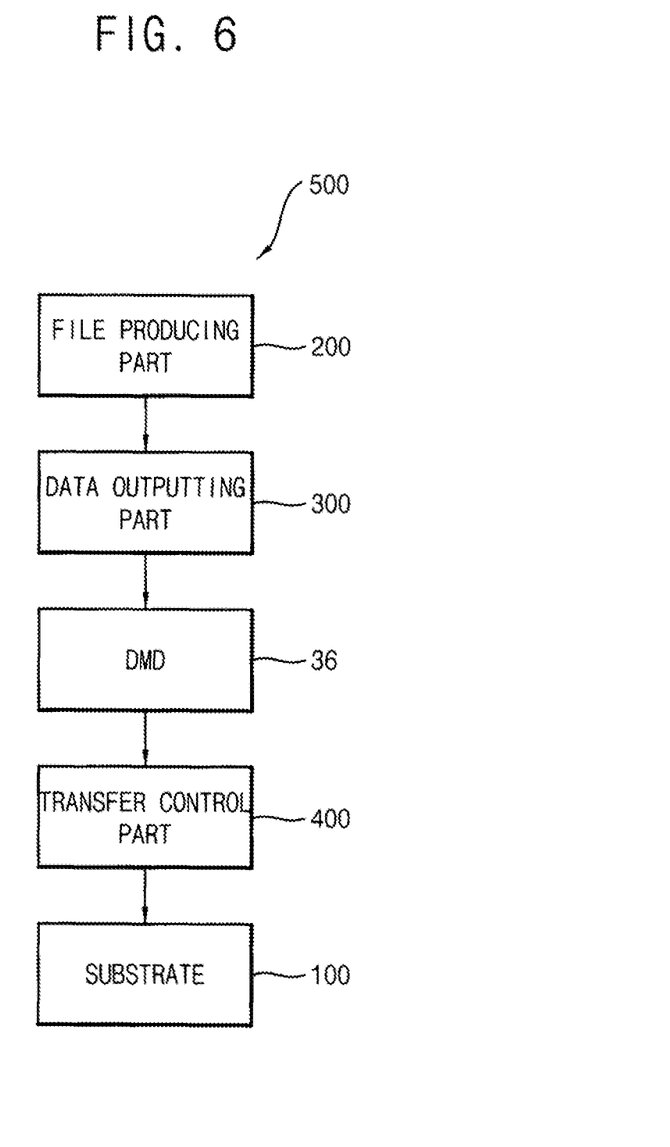
FIG. 6 is a block diagram of a system control part according to an exemplary embodiment of a maskless exposure device of FIG. 1.

FIG. 6 is a block diagram of a system control part according to an exemplary embodiment of the maskless exposure device of FIG. 1.

Referring to FIGS. 1 and 6, a system control part 500 may include a file producing part 200, a data outputting part 300 and a transfer control part 400.

The file producing part 200 produces a graphic data system ("GDS") file. The GDS file is an inverse of a multilayered computer-aided design (CAD) file. For example, the GDS file includes data for each layer, such as a gate pattern, an active pattern, source-drain patterns, etc.

The data outputting part 300 generates digital micro-mirror device on/off data from the graphic data system GDS file.

The data outputting part 300 outputs the digital micro-mirror device on/off data to the digital micro-mirror device 36.

The transfer control part 400 outputs a transfer signal which transfers the stage. The transfer control part 400 controls on/off timing of the exposure beam in response to the DMD on/off data received from the data outputting part 300, and transfers the stage.

A maskless exposure device according to an exemplary embodiment of the present inventive concept may manufacture a display substrate by using a manufacturing method that includes producing a graphic data system (GDS) file respectively corresponding to each of a plurality of patterns to be formed on a substrate, generating digital micro-mirror device (DMD) on/off data from the GDS files to control on/off timing of the digital micro-mirror device, and exposing the substrate according to the DMD on/off data.

The DMD on/off data is generated from the GDS file in the data outputting part 300. The DMD on/off data may be configured by '1's and '0's in a binary file. In an embodiment, when the on/off data is '1', the DMD is turned on so that light is irradiated to a substrate. Alternatively, when the on/off data is '0', the DMD is turned off so that no light is irradiated to the substrate.

The DMD selectively reflects light based on the DMD on/off data to expose the substrate 100 according to the pattern data stored in the GDS file. Therefore, a substrate having the patterns may be formed.

Figure 7:
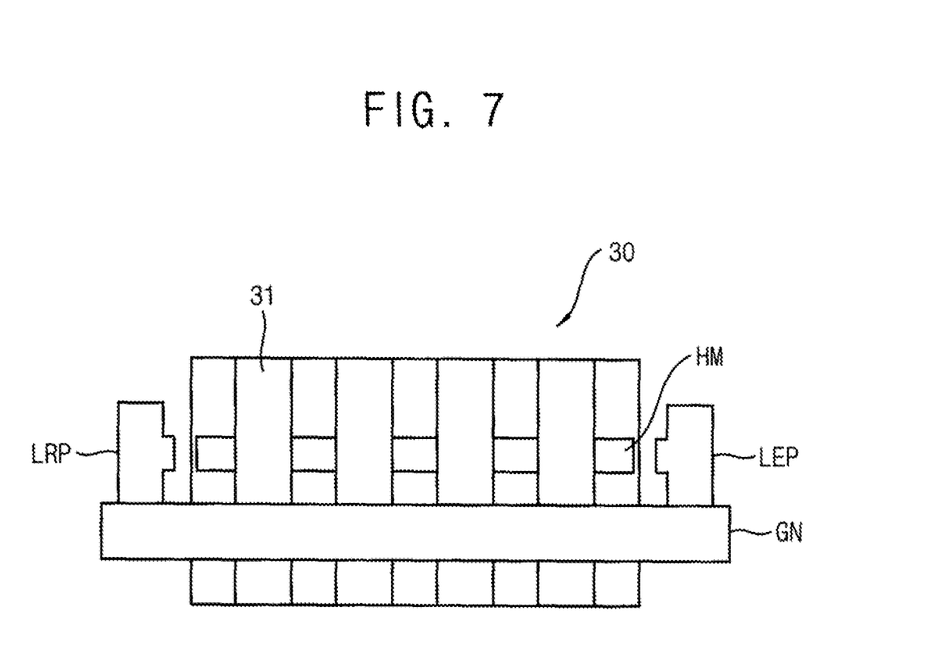
FIG. 7 is a side view of an exposure part according to an exemplary embodiment of the present inventive concept.

FIG. 7 is a side view of an exposure part 30 according to an exemplary embodiment of the present inventive concept.

Referring to FIG. 7, an exposure part 30 according to an exemplary embodiment of the present inventive concept includes a plurality of exposure heads 31, a reflecting member HM, a gantry GN, a light emitting part LEP and a light receiving part LRP.

The exposure heads 31 are mounted on the gantry GN. The exposure heads 31 includes the DMD. The DMD may irradiate an exposure beam in response to an on/off data signal. A source beam from a digital mirror of a cell of the DMD is reflected to generate the exposure beam, and the exposure beam is emitted from the exposure heads 31.

The reflecting member HM is disposed on a side surface of the exposure head 31. The number of reflecting members HM is the same as the number of exposure heads 31. That is, one reflecting member is disposed per exposure head. Reflecting surfaces of the reflecting members HM are parallel to each other.

The light emitting part LEP provides the reflecting member HM with light. The light emitting part LEP is mounted on the gantry GN. Thus, a light path from the light emitting part LEP may be consistently maintained.

The light receiving part LRP receives light from the light emitting part LEP. The light from the light emitting part LEP is received by the light receiving part LRP via the reflecting members HM. The light receiving part LRP is mounted on the gantry GN. Thus, only light having a consistent path may be received by the light receiving part LRP. Accordingly, when light is received by the light receiving part LRP, it may be determined that the exposure heads have not moved. However, when no light is received by the light receiving part LRP, it may be determined that at least one of the exposure heads has moved.

In a present exemplary embodiment, light emitted from the light emitting part LEP is received by the light receiving part LRP via all reflecting members HM.

According to a present exemplary embodiment, the exposure part 30 includes the light emitting part LEP and the light receiving part LRP mounted on the gantry GN. The light emitted from the light emitting part LEP is received by the light receiving part LRP via the reflecting members HM. Thus, when no light is received by the light receiving part LRP, it may be determined that at least one of the exposure heads has moved. That is, movement of the exposure heads during the exposure process may be detected in real time. Therefore, precise exposure may be performed.

Figure 8:
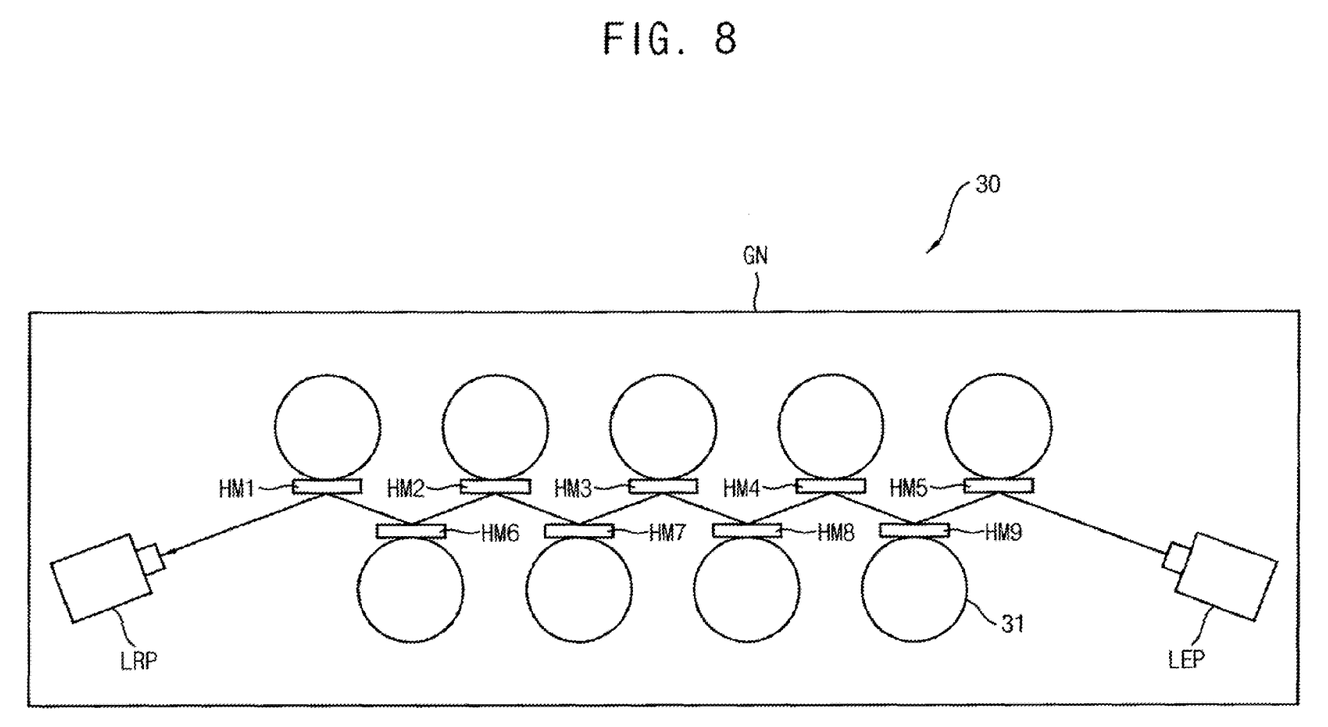
FIG. 8 is a top view of an exposure part according to an exemplary embodiment of the present inventive concept.

FIG. 8 is a top view of an exposure part 30 according to an exemplary embodiment of the present inventive concept.

FIG. 8 illustrates an ordinary arrangement of the exposure heads 31 of the exposure part 30.

The exposure heads 31 are disposed in two rows. For example, five exposure heads may be disposed in a first row, and four exposure heads may be disposed in a second row.

The reflecting members HM are disposed on a side surface of each exposure head 31. For example, an exposure part 30 according to an exemplary embodiment of the present inventive concept may include first to ninth reflecting members HM1, HM2, HM3, HM4, HM5, HM6, HM7, HM8 and HM9. The number of the reflecting members HM is the same as the number of the exposure heads 31. That is, one reflecting member is disposed per exposure head. Reflecting surfaces of the reflecting members HM are parallel with each other.

The light emitting part LEP provides the reflecting member HM with light. The light emitting part LEP is mounted on the gantry GN. Thus, a light path from the light emitting part LEP may be consistently maintained.

The light receiving part LRP receives the light from the light emitting part LEP. Light from the light emitting part LEP is received by the light receiving part LRP via the reflecting members HM. The light receiving part LRP is mounted on the gantry GN. Thus, only a light having a consistent path may be received by the light receiving part LRP. Accordingly, when the light is received by the light receiving part LRP, it may be determined that the exposure heads have not moved. However, when no light is received by the light receiving part LRP, it may be determined that at least one of the exposure heads has moved.

In a present exemplary embodiment, since the exposure heads 31 of the exposure part 30 is ordinarily arranged, light is received by the light receiving part LRP. Therefore, an exposure process may be performed without stopping.

Figure 9:
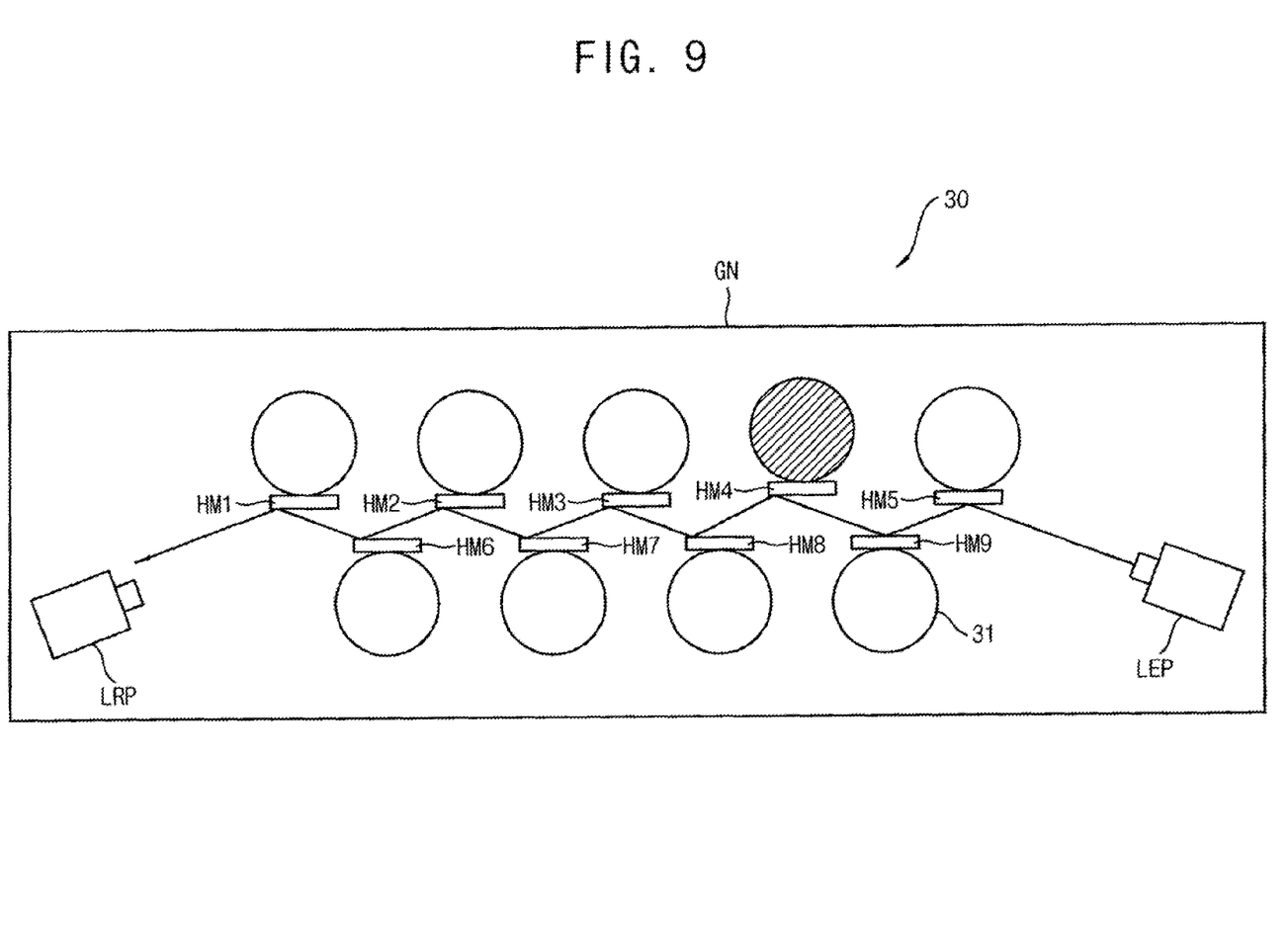
FIG. 9 is a top view of an exposure part according to an exemplary embodiment of the present inventive concept.

FIG. 9 is a top view of an exposure part according to an exemplary embodiment of the present inventive concept.

FIG. 9 illustrates a situation in which that the exposure heads 31 of the exposure part have moved.

The exposure heads 31 are disposed in two rows. For example, five exposure heads may be disposed in a first row, and four exposure heads may be disposed in a second row.

Each reflecting member HM is disposed on a side surface of the exposure head 31. For example, an exposure part 30 according to an exemplary embodiment of the present inventive concept may include first to ninth reflecting members HM1, HM2, HM3, HM4, HM5, HM6, HM7, HM8 and HM9. The number of the reflecting members HM is the same as the number of the exposure heads 31. That is, one reflecting member is disposed per exposure head. Reflecting surfaces of the reflecting members HM are parallel with each other.

The light emitting part LEP provides the reflecting member HM with light. The light emitting part LEP is mounted on the gantry GN. Thus, a light path from the light emitting part LEP may be consistently maintained.

The light receiving part LRP receives the light from the light emitting part LEP. The light from the light emitting part LEP is received by the light receiving part LRP via the reflecting members HM. The light receiving part LRP is mounted on the gantry GN. Thus, only light having a consistent path may be received by the light receiving part LRP. Accordingly, when light is received by the light receiving part LRP, it may be determined that the exposure heads have not moved. However, when no light is received by the light receiving part LRP, it may be determined that at least one of the exposure heads is moved.

In a present exemplary embodiment, since an exposure head has moved, no light is received by the light receiving part LRP. For example, a portion of the fourth reflecting member HM4 has been altered, so that a light path from the light emitting part LEP has changed. Thus, light from the light emitting part LEP is not received by the light receiving part LRP. Since no light is received by the light receiving part LRP, it may be determined that at least one of the exposure heads has moved. Thus, an exposure process is stopped. Thereafter, the exposure heads may be realigned. After the exposure heads have been realigned, the exposure process may be restarted. That is, movement of the exposure heads during the exposure process may be detected in real time. Therefore, a precise exposure may be performed.

Figure 10:
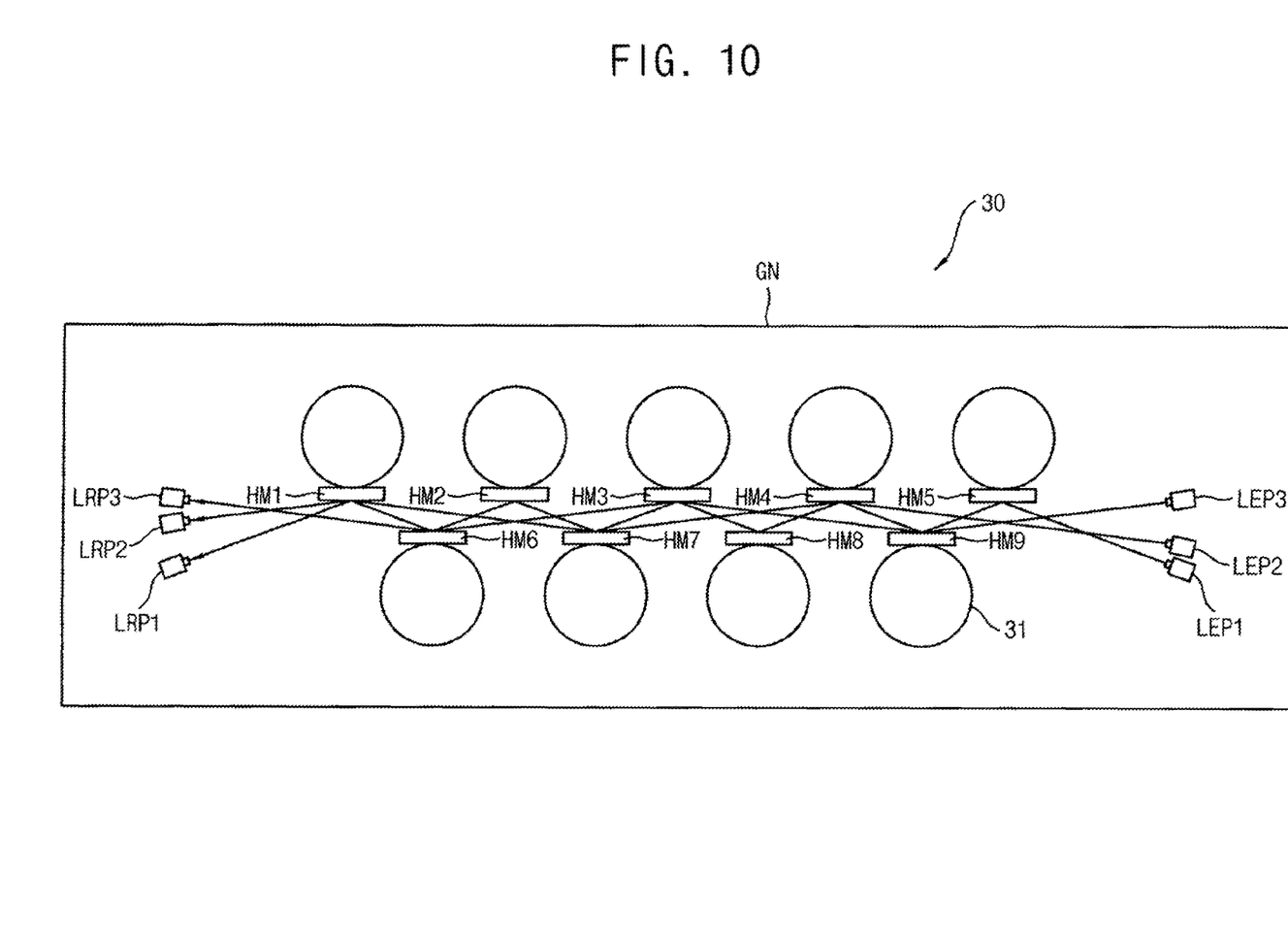
FIG. 10 is a top view of an exposure part according to an exemplary embodiment of the present inventive concept.

FIG. 10 is a top view of an exposure part according to an exemplary embodiment of the present inventive concept.

Referring to FIG. 10, an exposure part 30 according to an exemplary embodiment of the present inventive concept includes a plurality of exposure heads 31, a reflecting member HM, a gantry GN, a first light emitting part LEP1, a second light emitting part LEP2 and a third light emitting part LEP3, a first light receiving part LRP1, a second light receiving part LRP2 and a third light receiving part LRP3.

The exposure heads 31 is mounted on the gantry GN. Each exposure head 31 includes a DMD. The DMD may irradiate an exposure beam in response to an on/off data signal. A source beam from a digital mirror of a cell of the DMD is reflected to generate the exposure beam, and the exposure beam is emitted from the exposure heads 31.

Each reflecting member HM is disposed on a side surface of the exposure head 31. The number of the reflecting members HM is the same as the number of the exposure heads 31. That is, one reflecting member is disposed per exposure head. Reflecting surfaces of the reflecting members HM are parallel to each other.

The first light emitting part LEP1 provides the reflecting members HM with light. The first light emitting part LEP1 is mounted on the gantry GN. Thus, a light path from the first light emitting part LEP1 may be consistently maintained.

The first light receiving part LRP1 receives the light from the first light emitting part LEP1. Light from the first light emitting part LEP1 is received by the first light receiving part LRP1 via the reflecting members HM. The first light receiving part LRP1 is mounted on the gantry GN. Thus, only light having a consistent path may be received by the first light receiving part LRP1. Accordingly, when the light path from the first light emitting part LEP1 is altered, no light from the first light emitting part LEP1 is received by the first light receiving part LRP1.

The light emitted from the first light emitting part LEP1 is received by the first light receiving part LRP1 via all reflecting members HM. That is, the light emitted from the first light emitting part LEP1 is received by the first light receiving part LRP1 via the first to the ninth reflecting members HM1, HM2, HM3, HM4, HM5, HM6, HM7, HM8 and HM9.

The second light emitting part LEP2 provides the reflecting members HM with light. The second light emitting part LEP2 is mounted on the gantry GN. Thus, a light path from the second light emitting part LEP2 may be consistently maintained. The second light emitting part LEP2 may be disposed adjacent to the first light emitting part LEP1.

The second light receiving part LRP2 receives the light from the second light emitting part LEP2. Light from the second light emitting part LEP2 is received by the second light receiving part LRP2 via the reflecting members HM. The second light receiving part LRP2 is mounted on the gantry GN. Thus, only light having a consistent path may be received by the second light receiving part LRP2. Accordingly, when a light path from the second light emitting part LEP2 is altered, no light from the second light emitting part LEP2 is received by the second light receiving part LRP2. The second light receiving part LRP2 may be disposed adjacent to the first light receiving part LRP1.

The light emitted from the second light emitting part LEP2 is received by the second light receiving part LRP2 via a (3n−1)-th reflecting member of the first row ('n' is a natural number) and a 3n-th reflecting member of the second row. That is, the light emitted from the second light emitting part LEP2 is received by the second light receiving part LRP2 via the first, the fifth and the seventh reflecting member HM1, HM5 and HM7.

The third light emitting part LEP3 provides the reflecting members HM with light. The third light emitting part LEP3 is mounted on the gantry GN. Thus, a light path from the third light emitting part LEP3 may be consistently maintained. The third light emitting part LEP3 may be disposed adjacent to the first light emitting part LEP1.

The third light receiving part LRP3 receives the light from the third light emitting part LEP3. Light from the third light emitting part LEP3 is received by the third light receiving part LRP3 via the reflecting members HM. The third light receiving part LRP3 is mounted on the gantry GN. Thus, only light having a consistent path may be received by the third light receiving part LRP3. Accordingly, when a light path from the third light emitting part LEP3 is altered, no light from the third light emitting part LEP3 is received by the third light receiving part LRP3. The third light receiving part LRP3 may be disposed adjacent to the first light receiving part LRP1.

The light emitted from the third light emitting part LEP3 is received by the third light receiving part LRP3 via a 3n-th reflecting member of the first row ('n' is a natural number) and a (3n−2)-th reflecting member of the second row. That is, the light emitted from the third light emitting part LEP3 is received by the third light receiving part LRP3 via the third, the sixth and the ninth reflecting member HM3, HM6 and HM9.

An exposure part according to a present exemplary embodiment includes the first to the third light receiving parts LRP1, LRP2 and LRP3. When no light is received by at least one of the first to the third light receiving parts LRP1, LRP2 and LRP3, it may be determined that at least one of the exposure heads has moved.

When two adjacent reflecting members HM are moved by the same angle in an exposure part having one light emitting part and one light receiving part, the light from the light emitting part may be received by the light receiving part. Thus, although the exposure heads have moved, the movement of the exposure heads may not be detected.

However, an exposure part according to a present exemplary embodiment includes first to third light receiving parts LRP1, LRP2 and LRP3. Therefore, movement of the exposure heads may be precisely detected.

Figure 11:
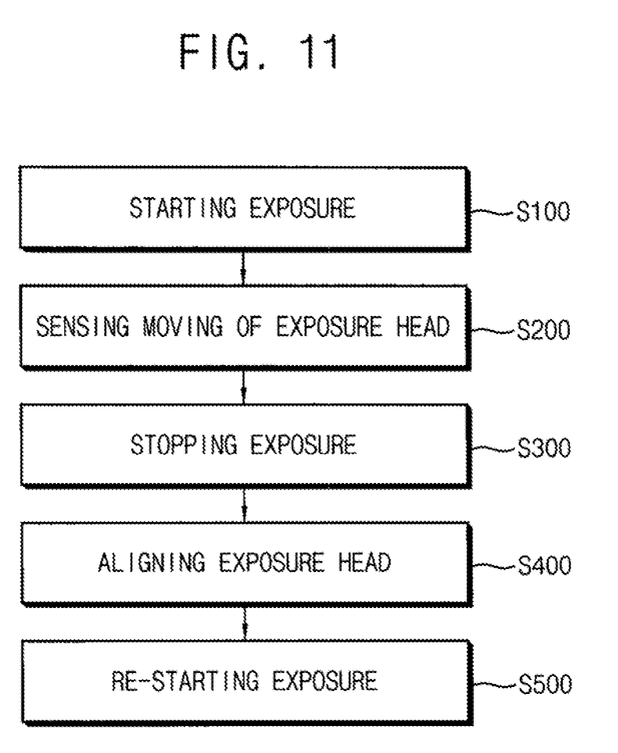
FIG. 11 is a block diagram of a maskless exposure method according to an exemplary embodiment of the present inventive concept.

FIG. 11 is a block diagram of a maskless exposure method according to an exemplary embodiment of the present inventive concept.

Referring to FIG. 11, a maskless exposure method according to an exemplary embodiment of the present inventive concept includes a starting exposure S100, sensing movement of the exposure heads S200, a stopping exposure S300, adjusting alignment of the exposure heads S400, and a re-start exposure S500.

A maskless exposure device according to an exemplary embodiment of the present inventive concept includes an exposure head 31, a reflecting member HM, a light emitting part LEP, a light receiving part LRP, and control part. The exposure head 31 includes a digital micro-mirror device ("DMD") configured to reflect a source beam received from an exposure source to a substrate to scan an exposure beam to the substrate. The exposure head 31 may be disposed with a staggered first row and second row.

In the process of the sensing movement of the exposure heads at step S200, movement of the exposure heads may be detected using the reflecting members HM, the light emitting part LEP and the light receiving part LRP. The reflecting members HM may be disposed on side surfaces of the exposure heads 31. The light emitting part LEP may be disposed adjacent to the exposure head 31. The light emitting part LEP provides the reflecting members HM with light. For example, the light may be a laser beam. The light receiving part LRP receives the light emitted from the light emitting part LEP via the reflecting members. When light is received by the light receiving part LRP, it may be determined that the exposure heads have not moved. However, when no light is received by the light receiving part LRP, it may be determined that at least one of the exposure heads has moved. When the exposure heads have been determined to have moved, the exposure process is stopped in step S300.

In the process of the adjusting alignment of the exposure heads at step S400, the exposure heads may be realigned by the control part. When the exposure heads have been determined to have moved, the exposure process is stopped. Thereafter, the control part realigns the exposure heads. For example, alignment data for the exposure heads may be stored in the control part. Thus, the control part can realign the exposure heads based on the data stored in the control part. After the exposure heads have been realigned, the exposure process may be restarted at step S500.

According to a present exemplary embodiment, the exposure part includes a light emitting part and a light receiving part mounted on the gantry and reflecting members disposed on side surfaces of the exposure heads. Light from the light emitting part is received by the light receiving part via the reflecting members. Thus, when no light is received by the light receiving part, it may be determined that at least one of the exposure heads has moved. In other words, non-receipt of light by the light receiving part indicates that at least one exposure head having a reflective member attached thereto has been moved out of alignment. That is, movement of the exposure heads during the exposure process may be detected in real time. Therefore, a precise exposure may be performed.

The foregoing is illustrative of embodiments of the present disclosure and is not to be construed as limiting thereof. Although a few exemplary embodiments of the present disclosure have been described, those skilled in the art will readily appreciate that many modifications are possible in the exemplary embodiments without materially departing from the novel teachings and advantages of the present inventive concept. Accordingly, all such modifications are intended to be included within the scope of the present invention as defined in the claims. The present inventive concept is defined by the following claims, with equivalents of the claims to be included therein.

What is claimed is:

1. A maskless exposure device comprising:
    a plurality of exposure heads, each exposure head including a digital micro-mirror device configured to scan an exposure beam to a substrate, wherein the exposure heads are disposed in staggered first and second rows;
    a plurality of reflecting members disposed on side surfaces of the exposure heads and having reflecting surfaces parallel with each other;
    a light emitting part configured to emit light to the reflecting members; and
    a light receiving part configured to receive light via the reflecting members.

2. The maskless exposure device of claim 1, wherein light emitted from the light emitting part is received by the light receiving part via all reflecting members.

3. The maskless exposure device of claim 1, further comprising:

a control part configured to control an alignment of the exposure heads.

4. The maskless exposure device of claim 1, further comprising:
a system control part configured to control the digital micro-mirror device using a graphic data system file.

5. The maskless exposure device of claim 4, wherein the system control part comprises:
a file producing part configured to produce graphic data system files respectively corresponding to each of a plurality of patterns to be formed on the substrate;
a data outputting part configured to generate digital micro-mirror device on/off data from the graphic data system files to control on/off timing of the digital micro-mirror devices; and
a transfer control part configured to output a transfer signal which transfers a stage configured to fix the substrate.

6. The maskless exposure device of claim 5, wherein the transfer control part controls on/off timing of the exposure beams in response to the digital micro-mirror device on/off data received from the data outputting part, and transfers the stage.

7. A maskless exposure device comprising:
a plurality of exposure heads configured to scan exposure beams to a substrate and disposed in staggered first and second rows; and
a plurality of reflecting members disposed on side surfaces of the exposure heads and having reflecting surfaces parallel with each other;
one or more light emitting parts configured to emit light to the reflecting members; and
one or more light receiving parts configured to receive the light emitted from the one or more light emitting parts via the reflecting members,
wherein light emitted from each of the one or more light emitting parts is received by a respective light receiving part of the one or more light receiving parts via the reflecting members.

8. The maskless exposure device of claim 7, wherein the one or more light receiving parts includes one light receiving part, and the one or more light receiving parts includes one light receiving part, and light emitted from the one light emitting part is received by the one light receiving part via all reflecting members.

9. The maskless exposure device of claim 8, wherein a condition of no light being received by the one light receiving part is indicative of at least one of the plurality of reflecting members having been moved.

10. The maskless exposure device of claim 7, wherein the one or more light receiving parts includes
a first light emitting part configured to emit light to the reflecting members;
a second light emitting part configured to emit light to the reflecting members and disposed adjacent to the first light emitting part; and
a third light emitting part configured to emit light to the reflecting members and disposed adjacent to the first light emitting part, and
wherein the one or more light receiving parts include:
a first light receiving part configured to receive light from the first light emitting part via the reflecting members;
a second light receiving part configured to receive light from the second light emitting part via the reflecting members and disposed adjacent to the first light receiving part; and
a third light receiving part configured to receive light from the third light emitting part via the reflecting members and disposed adjacent to the first light receiving part.

11. The maskless exposure device of claim 10, wherein the light emitted from the second light emitting part is received by the second light receiving part via a $(3n-1)$-th reflecting member of the first row, wherein 'n' is a natural number, and a $3n$-th reflecting member of the second row.

12. The maskless exposure device of claim 10, wherein the light emitted from the third light emitting part is received by the third light receiving part via a $3n$-th reflecting member of the first row ('n' is a natural number) and a $(3n-2)$-th reflecting member of the second row.

13. The maskless exposure device of claim 10, wherein a condition of no light being received by at least one of the first, second, or third light receiving parts is indicative of at least one of the plurality of reflecting members having been moved.

14. The maskless exposure device of claim 7, further comprising:
a control part configured to control an alignment of the exposure heads.

15. A method of maskless exposure, the method comprising:
starting an exposure using a maskless exposure device, wherein the maskless exposure device includes a plurality of exposure heads configured to scan exposure beams to a substrate and disposed in staggered first and second rows, a plurality of reflecting members disposed on side surfaces of the exposure heads and having reflecting surfaces parallel with each other, a light emitting part configured to emit light to the reflecting members, and a light receiving part configured to receive light via the reflecting members;
sensing movement of the exposure heads;
realigning the exposure heads when the movement of the exposure heads is detected; and
re-starting the exposure.

16. The method of claim 15, wherein light emitted from the light emitting part is received by the light receiving part via the reflecting members.

17. The method of claim 16, wherein sensing movement of the exposure heads comprises stopping the exposure when no light is received by the light receiving part.

18. The method of claim 15, wherein the light emitting part comprises:
a first light emitting part configured to emit light to the reflecting members;
a second light emitting part configured to emit light to the reflecting members and disposed adjacent to the first light emitting part; and
a third light emitting part configured to emit light to the reflecting members and disposed adjacent to the first light emitting part, and
wherein the light receiving part comprises:
a first light receiving part configured to receive light from the first light emitting part via the reflecting members;
a second light receiving part configured to receive light from the second light emitting part via the reflecting members and disposed adjacent to the first light receiving part; and
a third light receiving part configured to receive light from the third light emitting part via the reflecting members and disposed adjacent to the first light receiving part.

19. The method of claim 18, wherein light emitted from the first light emitting part is received by the first light receiving part via all reflecting members, and light emitted from the second light emitting part is received by the second light receiving part via a (3n−1)-th reflecting member of the first row, wherein 'n' is a natural number, and a 3n-th reflecting member of the second row, and wherein light emitted from the third light emitting part is received by the third light receiving part via a 3n-th reflecting member of the first row and a (3n−2)-th reflecting member of the second row.

20. The method of claim 19, wherein sensing movement of the exposure heads comprising stopping the exposure when no light is received by at least one of the first to third light receiving parts.

* * * * *